(12) United States Patent
Lee et al.

(10) Patent No.: US 7,956,449 B2
(45) Date of Patent: Jun. 7, 2011

(54) STACKED INTEGRATED CIRCUIT PACKAGE SYSTEM

(75) Inventors: KyungHoon Lee, Icheon (KR); Oh Han Kim, Icheon (KR)

(73) Assignee: STATS Chippac Ltd., Singapore (SG)

( * ) Notice: Subject to any disclaimer, the term of this patent is extended or adjusted under 35 U.S.C. 154(b) by 356 days.

(21) Appl. No.: 12/146,135

(22) Filed: Jun. 25, 2008

(65) Prior Publication Data
US 2009/0321907 A1 Dec. 31, 2009

(51) Int. Cl.
*H01L 23/02* (2006.01)
(52) U.S. Cl. ............... 257/686; 257/E25.013; 257/685; 257/723; 257/777; 438/109
(58) Field of Classification Search ........... 257/E21.505, 257/E23.01, 685, 686, 723, 777, E25.013; 438/108, 109; 361/760
See application file for complete search history.

(56) References Cited

U.S. PATENT DOCUMENTS

| | | | |
|---|---|---|---|
| 5,739,581 A * | 4/1998 | Chillara et al. ............... 257/668 |
| 6,353,263 B1 * | 3/2002 | Dotta et al. .................... 257/777 |
| 6,445,064 B1 | 9/2002 | Ishii et al. |
| 6,521,881 B2 * | 2/2003 | Tu et al. ..................... 250/208.1 |
| 6,621,172 B2 * | 9/2003 | Nakayama et al. ........... 257/787 |
| 6,717,252 B2 * | 4/2004 | Saeki ............................ 257/686 |
| 6,787,916 B2 * | 9/2004 | Halahan ........................ 257/777 |
| 6,838,761 B2 | 1/2005 | Karnezos |
| 6,919,631 B1 * | 7/2005 | Hoffman et al. ............... 257/707 |
| 6,946,323 B1 * | 9/2005 | Heo ............................... 438/109 |
| 7,091,623 B2 * | 8/2006 | Tsai et al. ...................... 257/783 |
| 7,109,576 B2 * | 9/2006 | Bolken et al. ................. 257/686 |
| 7,235,871 B2 | 6/2007 | Corisis |
| 7,239,164 B2 * | 7/2007 | Tamaki ......................... 324/763 |
| 7,279,786 B2 * | 10/2007 | Kim ............................... 257/686 |
| 7,288,835 B2 * | 10/2007 | Yim et al. ..................... 257/685 |
| 7,354,800 B2 * | 4/2008 | Carson ........................ 438/109 |
| 7,453,153 B2 * | 11/2008 | Saita et al. .................... 257/777 |
| 7,456,495 B2 * | 11/2008 | Pohl et al. ..................... 257/686 |
| 7,468,556 B2 * | 12/2008 | Logan et al. .................. 257/723 |
| 7,550,832 B2 * | 6/2009 | Weng et al. ................... 257/685 |
| 7,598,606 B2 * | 10/2009 | Chow et al. ................... 257/686 |
| 7,626,253 B2 * | 12/2009 | Onodera et al. .............. 257/686 |
| 7,642,633 B2 * | 1/2010 | Hirose et al. ................. 257/686 |
| 7,723,159 B2 * | 5/2010 | Do et al. ...................... 438/113 |
| 7,723,852 B1 * | 5/2010 | Kim et al. ..................... 257/777 |
| 7,732,252 B2 * | 6/2010 | Chow et al. ................... 438/107 |
| 7,807,502 B2 * | 10/2010 | Kwang et al. ................. 438/108 |
| 2006/0267175 A1 | 11/2006 | Lee |
| 2007/0170570 A1 * | 7/2007 | Camacho et al. ............ 257/686 |
| 2008/0029869 A1 * | 2/2008 | Kwon et al. ................... 257/686 |
| 2008/0054451 A1 * | 3/2008 | Bauer et al. ................... 257/723 |
| 2008/0157321 A1 * | 7/2008 | Camacho et al. ............ 257/686 |

* cited by examiner

*Primary Examiner* — Chris Chu
(74) *Attorney, Agent, or Firm* — Mikio Ishimaru

(57) ABSTRACT

A stacked integrated circuit package system includes: forming a recessed integrated circuit package system having a first encapsulation over a first integrated circuit and an interior cavity in the first encapsulation; forming a mountable integrated circuit package system having a second integrated circuit over a carrier; and mounting the recessed integrated circuit package system over the mountable integrated circuit package system with the second integrated circuit within the interior cavity and the first integrated circuit coupled with the carrier.

17 Claims, 6 Drawing Sheets

STACKED INTEGRATED CIRCUIT PACKAGE SYSTEM

TECHNICAL FIELD

The present invention relates generally to an integrated circuit package system and more particularly to a stacked integrated circuit package system.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate.

Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density has led to the development of multi-chip packages, a package in package (PIP), a package on package (POP), or a combination thereof in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs all of which are primary goals of the computer industry.

However, PIP and POP products encounter various problems. The process of stacking integrated circuit packages can suffer from yield and reliability issues due to misalignment of connecting electrical contacts. As the pitch of the electrical interconnect such as solder balls or solder bumps, decreases, misalignment of electrical connections becomes an increasing problem affecting the yield, reliability, and cost of the end product.

Thus, a need still remains for a stacked integrated circuit package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package system including: forming a recessed integrated circuit package system having a first encapsulation over a first integrated circuit and an interior cavity in the first encapsulation; forming a mountable integrated circuit package system having a second integrated circuit over a carrier; and mounting the recessed integrated circuit package system over the mountable integrated circuit package system with the second integrated circuit within the interior cavity and the first integrated circuit coupled with the carrier.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
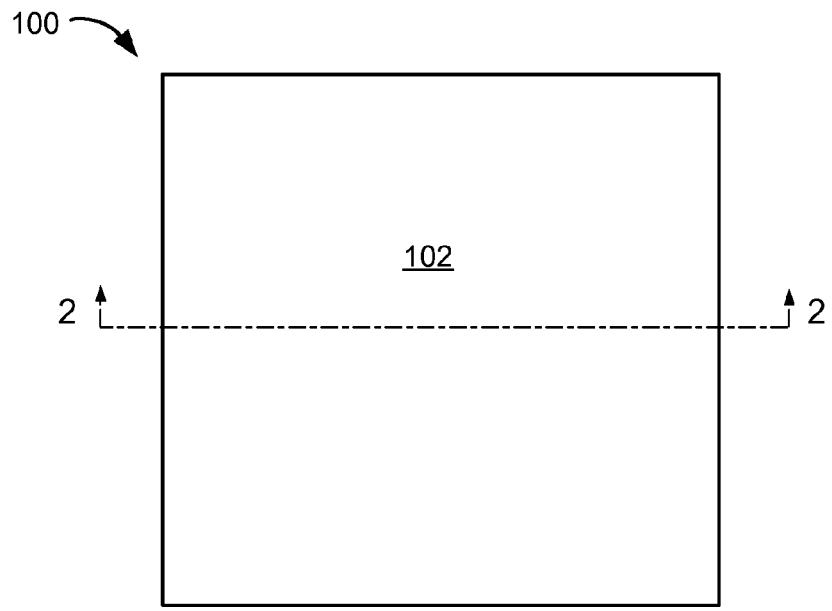
FIG. 1 is a top view of a stacked integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of a stacked integrated circuit package system 100 in a first embodiment of the present invention. The top view depicts a first encapsulation 102, such as an epoxy molding compound.

Figure 2:
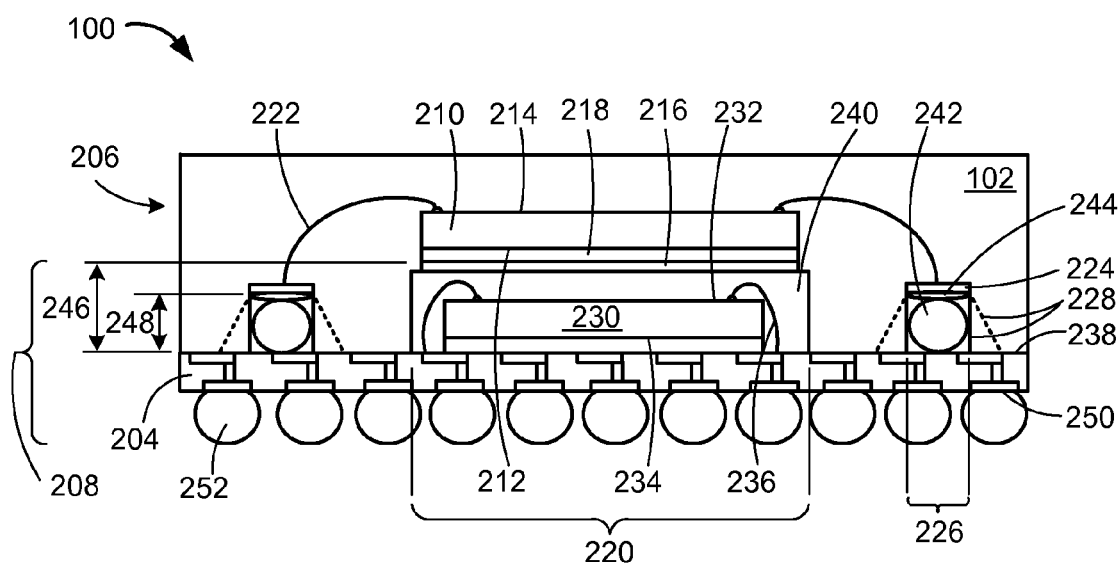
FIG. 2 is a cross-sectional view of the stacked integrated circuit package system along line 2-2 of FIG. 1.

Referring now to FIG. 2, therein is shown a cross-sectional view of the stacked integrated circuit package system 100 along line 2-2 of FIG. 1. The cross-sectional view depicts a recessed integrated circuit package system 206 mounted over a mountable integrated circuit package system 208.

The recessed integrated circuit package system 206 includes a first integrated circuit 210, such as an integrated circuit die, covered by the first encapsulation 102. The first integrated circuit 210 has a first non-active side 212 and a first active side 214, wherein the first active side 214 includes active circuitry fabricated thereon. In this example, a mounting structure 216, such as a die paddle including gold, can be between the first non-active side 212 of the first integrated circuit 210 and a die attach layer 218, such as a die-attach adhesive.

In the central portion of the recessed integrated circuit package system 206, an interior cavity 220 can be underneath the die attach layer 218. First internal interconnects 222, such as bond wires or ribbon bond wires, can connect between the first active side 214 of the first integrated circuit 210 and conductive sites 224, also covered by the first encapsulation 102.

At a periphery portion of the recessed integrated circuit package system 206, peripheral cavities 226 can be underneath the conductive sites 224, such as terminals, of the recessed integrated circuit package system 206. Walls 228 of the peripheral cavities 226 can be in different configurations. For example, the walls 228 can be vertical or non-vertical sloped, as depicted with dotted lines, with a wider opening at the bottom portion of the peripheral cavities 226.

The first encapsulation 102 also cover the first internal interconnects 222. The first encapsulation 102 partially covers the mounting structure 216 exposing a portion thereof with the interior cavity 220. The first encapsulation 102 also partially covers the conductive sites 224 exposing a portion thereof with the peripheral cavities 226.

The mountable integrated circuit package system 208 includes a second integrated circuit 230, such as an integrated circuit die, over a carrier 204, such as a laminated substrate. The second integrated circuit 230 also has a second non-active side 234 and a second active side 232, wherein the second active side 232 includes active circuitry fabricated thereon. In this example, the second non-active side 234 faces the carrier 204.

Second internal interconnects 236, such as bond wires or ribbon bond wires, can connect between the second active side 232 of the second integrated circuit 230 and a top side 238 of the carrier 204. A second encapsulation 240, such as a cover of epoxy molding compound, can cover the second integrated circuit 230 and the second internal interconnects 236 over the carrier 204. The second encapsulation 240 of the mountable integrated circuit package system 208 can be within the interior cavity 220 of the recessed integrated circuit package system 206.

Stacking interconnects 242, such as solder balls, can connect the recessed integrated circuit package system 206 and the mountable integrated circuit package system 208. The stacking interconnects 242 can couple the top side 238 of the carrier 204 and the conductive sites 224. The stacking interconnects 242 are preferably within the peripheral cavities 226. A conductive structure 244, such as solder printing or solder paste, can couple the conductive sites 224 and the stacking interconnects 242.

As an example, the interior cavity 220 includes an interior height 246 from the mounting structure 216 to the top side 238 of the carrier 204. Also as an example, the peripheral cavities 226 include a peripheral height 248 from the conductive structure 244 to the top side 238 of the carrier 204.

For illustrative purposes, the stacked integrated circuit package system 100 is shown with the interior cavity 220 different from the peripheral height 248, although it is understood that the interior height 246 and the peripheral height 248 can be different from shown. For example, the interior height 246 and the peripheral height 248 can be the same height or reversed height value relative to each other.

The first encapsulation 102 and the second encapsulation 240 can expose a bottom side 250 of the carrier 204. External interconnects 252, such as solder balls, can be attached below and to the carrier 204 for connection to the next system level (not shown), such as a printed circuit board or another stacked integrated circuit package system.

It has been discovered that the present invention provides thin profile package by placing the second integrated circuit and the second encapsulation within the interior cavity of the first encapsulation. This feature can reduce the total height of the stacked integrated circuit package system.

It has also been discovered that in the present invention, the non-vertical walls of the peripheral cavities for the stacking interconnects of the recessed integrated circuit package system can facilitate faster and more reliable inspection of interconnects during the manufacturing process. This feature can further reduce manufacturing cost and increase reliability. The non-vertical walls can also help alignment of the recessed integrated circuit package system and the mountable integrated circuit package system.

Figure 3:
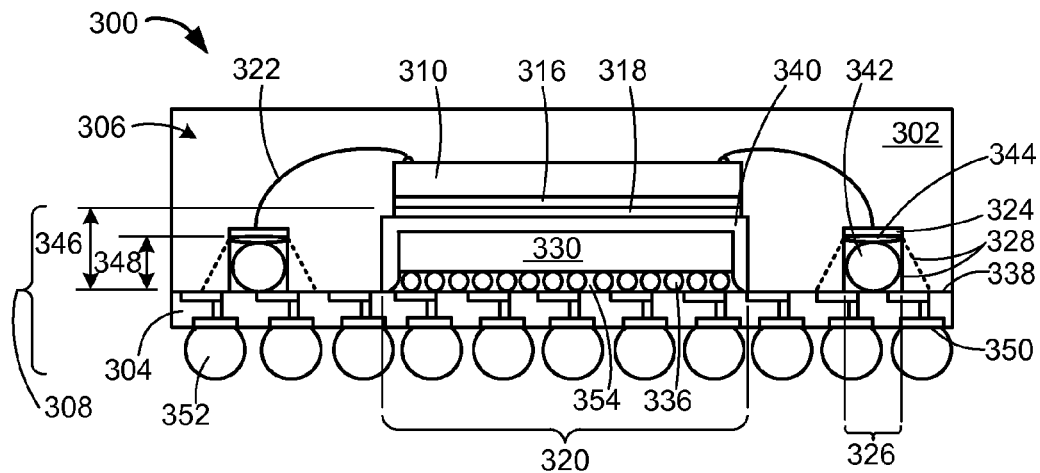
FIG. 3 is a cross-sectional view of a stacked integrated circuit package system exemplified by the top view of FIG. 1 along line 2-2 of FIG. 1 in a second embodiment of the present invention.

Referring now to FIG. 3, therein is shown a cross-sectional view of a stacked integrated circuit package system 300 exemplified by the top view of FIG. 1 along line 2-2 of FIG. 1 in a second embodiment of the present invention. The stacked integrated circuit package system 300 includes structural similarities to the stacked integrated circuit package system 100 of FIG. 2. The cross-sectional view depicts a recessed integrated circuit package system 306 mounted over a mountable integrated circuit package system 308.

The recessed integrated circuit package system 306 includes a first integrated circuit 310, such as an integrated circuit die, covered by a first encapsulation 302. In this example, a mounting structure 316, such as a die paddle including gold, can be between the first integrated circuit 310 and a die attach layer 318.

In the central portion of the recessed integrated circuit package system 306, an interior cavity 320 can be underneath the die attach layer 318. First internal interconnects 322 can connect between the first integrated circuit 310 and conductive sites 324, also covered by the first encapsulation 302.

At a periphery portion of the recessed integrated circuit package system 306, peripheral cavities 326 can be underneath the conductive sites 324, such as terminals, of the recessed integrated circuit package system 306. Walls 328 of the peripheral cavities 326 can be in different configurations. For example, the walls 328 can be vertical or non-vertical sloped, as depicted with dotted lines, with a wider opening at the bottom portion of the peripheral cavities 326.

The first encapsulation 302 also cover the first internal interconnects 322. The first encapsulation 302 partially covers the mounting structure 316 exposing a portion thereof with the interior cavity. The first encapsulation 302 also partially covers the conductive sites 324 exposing a portion thereof with the peripheral cavities 326.

The mountable integrated circuit package system 308 includes a second integrated circuit 330, such as a flip chip, over a carrier 304, such as a laminated substrate. Second internal interconnects 336, such as solder bumps, can connect between the second integrated circuit 330 and a top side 338 of the carrier 304. An underfill 354 can surround the second internal interconnects 336 between the second integrated circuit 330 and the carrier 304.

A second encapsulation 340, such as a cover of epoxy molding compound, can cover the second integrated circuit 330 and the second internal interconnects 336 over the carrier 304. The second encapsulation 340 of the mountable integrated circuit package system 308 can be within the interior cavity 320 of the recessed integrated circuit package system 306. The second encapsulation 340 can be optional in which case, the second integrated circuit 330 can be within the interior cavity 320.

Stacking interconnects 342, such as solder balls, can connect the recessed integrated circuit package system 306 and the mountable integrated circuit package system 308. The stacking interconnects 342 can couple the top side 338 of the carrier 304 and the conductive sites 324. The stacking interconnects 342 are preferably within the peripheral cavities 326. A conductive structure 344, such as solder printing or solder paste, can couple the conductive sites 324 and the stacking interconnects 342.

As an example, the interior cavity 320 includes an interior height 346 from the mounting structure 316 to the top side 338 of the carrier 304. Also as an example, the peripheral cavities 326 include a peripheral height 348 from the conductive structure 344 to the top side 338 of the carrier 304.

For illustrative purposes, the stacked integrated circuit package system 300 is shown with the interior cavity 320 different from the peripheral height 348, although it is understood that the interior height 346 and the peripheral height 348 can be different from shown. For example, the interior height 346 and the peripheral height 348 can be the same height or reversed height value relative to each other.

The first encapsulation 302 and the second encapsulation 340 can expose a bottom side 350 of the carrier 304. External interconnects 352, such as solder balls, can be attached below and to the carrier 304 for connection to the next system level (not shown), such as a printed circuit board or another stacked integrated circuit package system.

Figure 4:
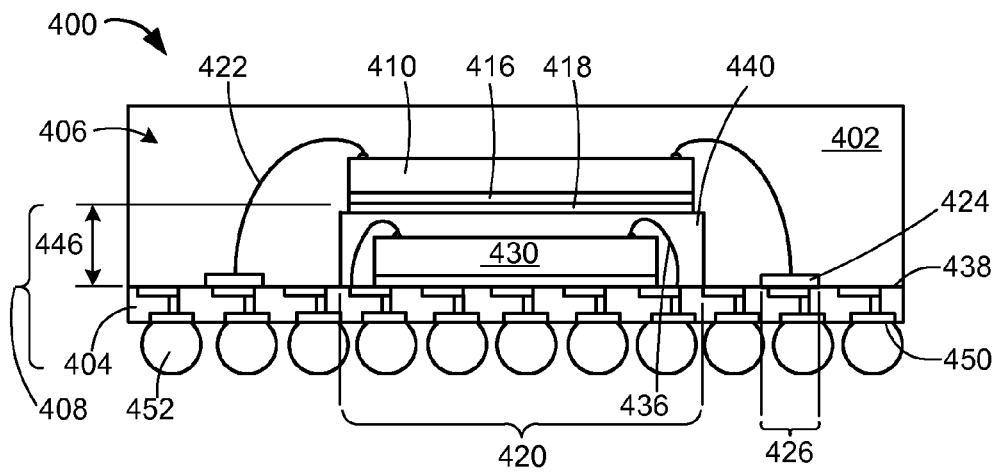
FIG. 4 is a cross-sectional view of a stacked integrated circuit package system exemplified by the top view of FIG. 1 along line 2-2 of FIG. 1 in a third embodiment of the present invention.

Referring now to FIG. 4, therein is shown a cross-sectional view of a stacked integrated circuit package system 400 exemplified by the top view of FIG. 1 along line 2-2 of FIG. 1 in a third embodiment of the present invention. The stacked integrated circuit package system 400 includes structural similarities to the stacked integrated circuit package system 100 of FIG. 2. The cross-sectional view depicts a recessed integrated circuit package system 406 mounted over a mountable integrated circuit package system 408.

The recessed integrated circuit package system 406 includes a first integrated circuit 410, such as an integrated circuit die, covered by a first encapsulation 402. In this example, a mounting structure 416, such as a die paddle including gold, can be between the first integrated circuit 410 and a die attach layer 418.

In the central portion of the recessed integrated circuit package system 406, an interior cavity 420 can be underneath the die attach layer 418. First internal interconnects 422, such as bond wires or ribbon bond wires, can connect between the first integrated circuit 410 and conductive sites 424, also covered by the first encapsulation 402.

The first encapsulation 402 also cover the first internal interconnects 422. The first encapsulation 402 partially covers the mounting structure 416 exposing a portion thereof with the interior cavity 420. The first encapsulation 402 also partially covers the conductive sites 424 exposing a portion thereof with peripheral cavities 426. At a periphery portion of the recessed integrated circuit package system 406, the conductive sites 424 can connect the recessed integrated circuit package system 406 and a carrier 404 of the mountable integrated circuit package system 408. As an example, the recessed integrated circuit package system 406 can connect onto the carrier 404.

The mountable integrated circuit package system 408 includes a second integrated circuit 430, such as an integrated circuit die, over the carrier 404. Second internal interconnects 436 can connect between the second integrated circuit 430 and a top side 438 of the carrier 404. A second encapsulation 440 can cover the second integrated circuit 430 and the second internal interconnects 436 over the carrier 404. The second encapsulation 440 of the mountable integrated circuit package system 408 can be within the interior cavity 420. As an example, the interior cavity 420 includes an interior height 446 from the mounting structure 416 to the top side 438 of the carrier 404.

The first encapsulation 402 and the second encapsulation 440 can expose a bottom side 450 of the carrier 404. External interconnects 452, such as solder balls, can be attached below and to the carrier 404 for connection to the next system level (not shown), such as a printed circuit board or another stacked integrated circuit package system.

Figure 5:
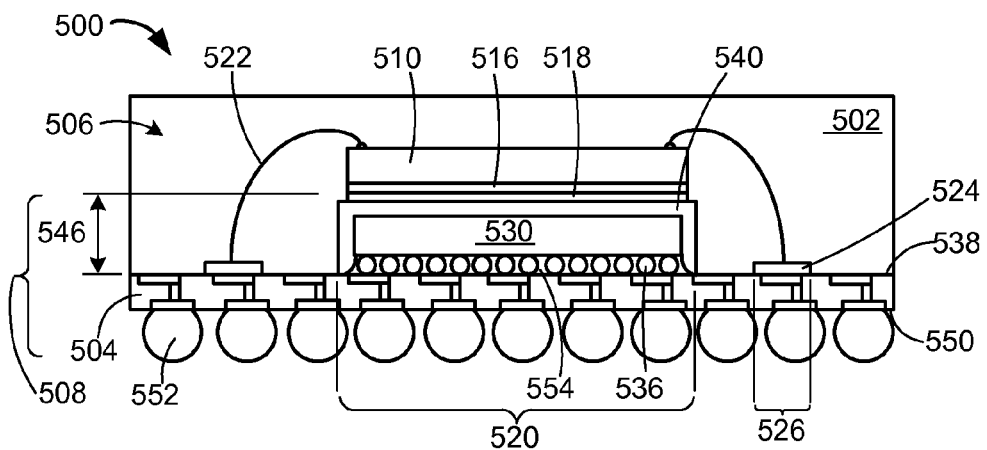
FIG. 5 is a cross-sectional view of a stacked integrated circuit package system exemplified by the top view of FIG. 1 along line 2-2 of FIG. 1 in a fourth embodiment of the present invention.

Referring now to FIG. 5, therein is shown a cross-sectional view of a stacked integrated circuit package system 500 exemplified by the top view of FIG. 1 along line 2-2 of FIG. 1 in a fourth embodiment. The stacked integrated circuit package system 500 includes structural similarities to the stacked integrated circuit package system 300 of FIG. 3. The cross-sectional view depicts a recessed integrated circuit package system 506 mounted over a mountable integrated circuit package system 508.

The recessed integrated circuit package system 506 includes a first integrated circuit 510, such as an integrated circuit die, covered by a first encapsulation 502. In this example, a mounting structure 516, such as a die paddle including gold, can be between the first integrated circuit 510 and a die attach layer 518.

In the central portion of the recessed integrated circuit package system 506, an interior cavity 520 can be underneath the die attach layer 518. First internal interconnects 522, such as bond wires or ribbon bond wires, can connect between the first integrated circuit 510 and conductive sites 524, also covered by the first encapsulation 502.

The first encapsulation 502 also cover the first internal interconnects 522. The first encapsulation 502 partially covers the mounting structure 516 exposing a portion thereof with the interior cavity 520. The first encapsulation 502 also partially covers the conductive sites 524 exposing a portion thereof with peripheral cavities 526. At a periphery portion of the recessed integrated circuit package system 506, the conductive sites 524 can connect the recessed integrated circuit package system 506 and a carrier 504 of the mountable integrated circuit package system 508. As an example, the recessed integrated circuit package system 506 can connect onto the carrier 504.

The mountable integrated circuit package system 508 includes a second integrated circuit 530, such as a flip chip, over the carrier 504, such as a laminated substrate. Second internal interconnects 536, such as solder bumps, can connect between the second integrated circuit 530 and a top side 538 of the carrier 504. An underfill 554 can surround the second internal interconnects 536 between the second integrated circuit 530 and the carrier 504.

A second encapsulation 540, such as a cover of epoxy molding compound, can cover the second integrated circuit 530 and the second internal interconnects 536 over the carrier 504. The second encapsulation 540 of the mountable integrated circuit package system 508 can be within the interior cavity 520 of the recessed integrated circuit package system 506. The second encapsulation 540 can be optional in which case, the second integrated circuit 530 can be within the interior cavity 520. As an example, the interior cavity 520 includes an interior height 546 from the mounting structure 516 to the top side 538 of the carrier 504.

The first encapsulation 502 and the second encapsulation 540 can expose a bottom side 550 of the carrier 504. External interconnects 552, such as solder balls, can be attached below and to the carrier 504 for connection to the next system level (not shown), such as a printed circuit board or another stacked integrated circuit package system.

Figure 6:
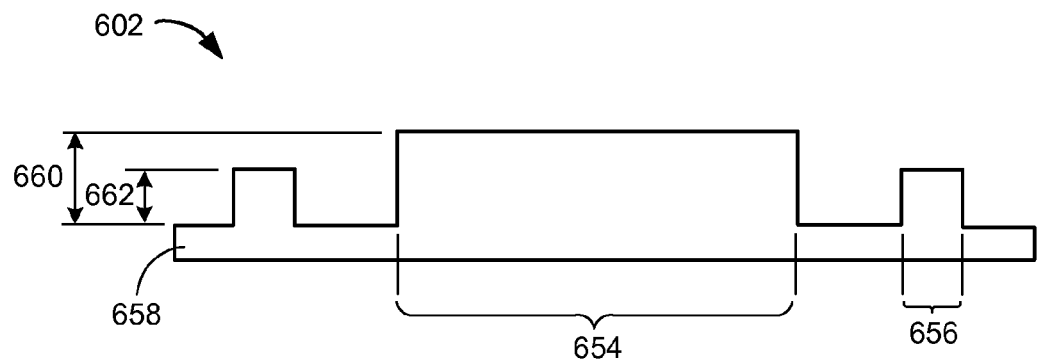
FIG. 6 is a cross-sectional view of a lead frame.

Referring now to FIG. 6, therein is shown a cross-sectional view of a lead frame 602. The cross-sectional view depicts the lead frame 602 including a central portion 654 and a periphery portion 656 extending from a base 658. A center height 660 of the central portion 654 can be higher than an outer height 662 of the periphery portion 656. The material of the lead frame 602, in this example, can be copper.

It has been discovered that the present invention provides lower cost manufacturing process by using copper lead frame. Copper lead frame can be removed by a number of low cost means, including chemical etching.

Figure 7:
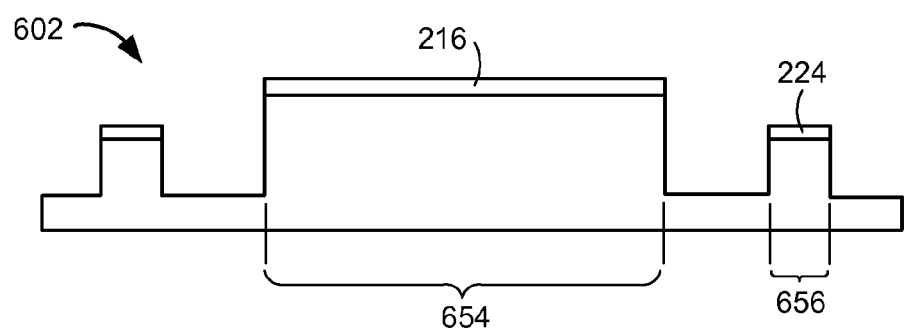
FIG. 7 is the structure of FIG. 6 in forming conductive sites and the mounting structure over the lead frame.

Referring now to FIG. 7, therein is shown the structure of FIG. 6 in forming the conductive sites 224 and the mounting structure 216 over the lead frame 602. Conductive material, such as gold, is placed, such as plating, over the periphery portion 656 to form the conductive sites 224 and over the central portion 654 to form the mounting structure 216.

For illustrative purposes, the conductive material is not shown between the periphery portion 656 and the central portion 654. Although it is understood that the conductive material used for forming the conductive sites 224 and the mounting structure 216 can be formed between the periphery portion 656 and the central portion 654.

Figure 8:
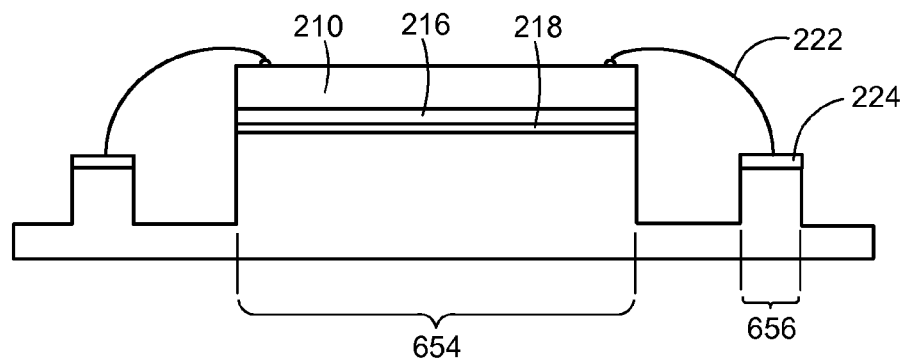
FIG. 8 is the structure of FIG. 7 in connecting the first integrated circuit die and the conductive sites.

Referring now to FIG. 8, therein is shown the structure of FIG. 7 in connecting the first integrated circuit 210 and the conductive sites 224. The first integrated circuit 210 can mount over the mounting structure 216 with the die attach layer 218 in between and over the central portion 654. The first internal interconnects 222 can connect between the first integrated circuit 210 and the conductive sites 224 over the periphery portion 656.

Figure 9:
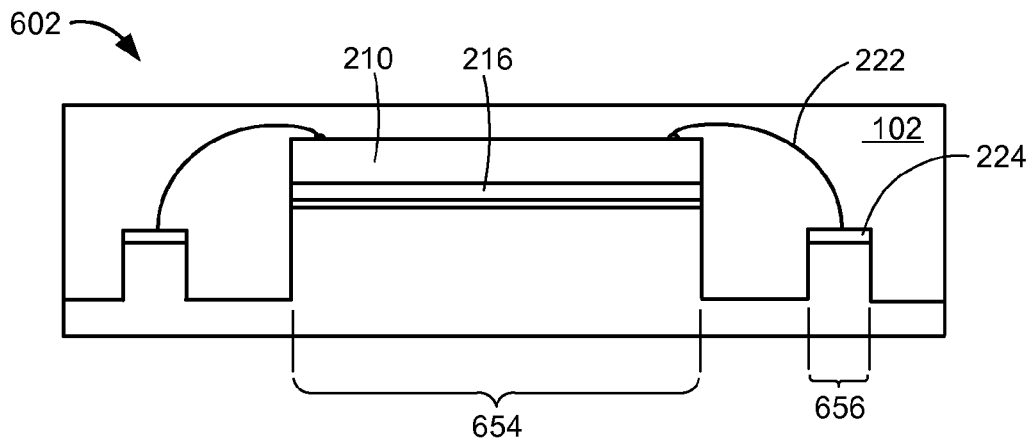
FIG. 9 is the structure of FIG. 8 in forming the first encapsulation.

Referring now to FIG. 9, therein is shown the structure of FIG. 8 in forming the first encapsulation 102. The first encapsulation 102 can be formed over the lead frame 602 covering the first integrated circuit 210 and the first internal interconnects 222. The first encapsulation 102 does not cover the portion of the conductive sites 224 facing the periphery portion 656 and the portion of the mounting structure 216 facing the central portion 654.

Figure 10:
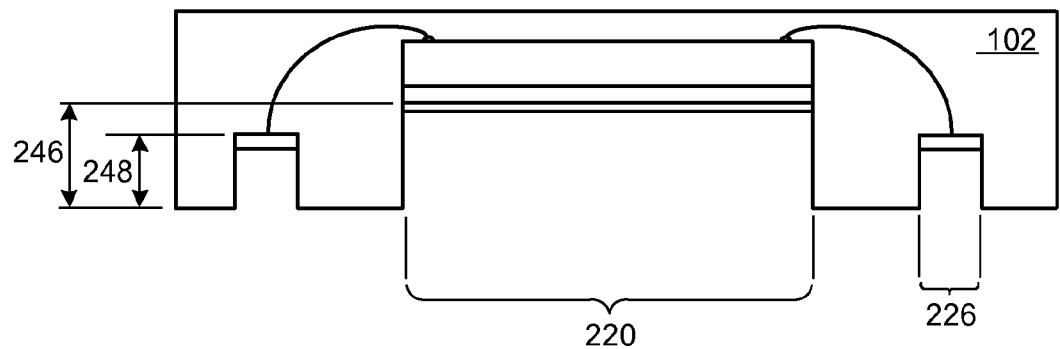
FIG. 10 is the structure of FIG. 9 in forming the recessed integrated circuit package system of FIG. 2.

Referring now to FIG. 10, therein is shown the structure of FIG. 9 in forming the recessed integrated circuit package system 206 of FIG. 2. The lead frame 602 of FIG. 9 can be removed by a number of processes, such as chemical etching, to form the interior cavity 220 in the central portion of the first encapsulation 102 and to form the peripheral cavities 226 on the periphery of the first encapsulation 102. The interior height 246 of the interior cavity 220 can be formed from the center height 660 of FIG. 6 of the central portion 654 of FIG. 6 of the lead frame 602. The peripheral height 248 of the peripheral cavities 226 can be formed from the outer height 662 of FIG. 6 of the periphery portion 656 of FIG. 6 of the lead frame 602.

Figure 11:
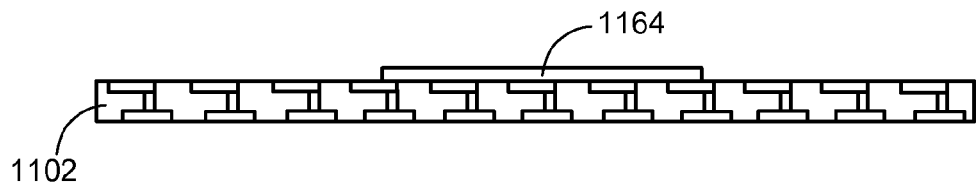
FIG. 11 is a cross-sectional view of a carrier strip.

Referring now to FIG. 11, therein is shown a cross-sectional view of a carrier strip 1102. The cross-sectional view depicts an adhesive 1164, such as a die attach adhesive, over the carrier strip 1102. For illustrative purposes, the adhesive 1164 is shown over the carrier strip 1102, although it is understood that the carrier strip 1102 can have multiple instantiations of the adhesive 1164.

Figure 12:
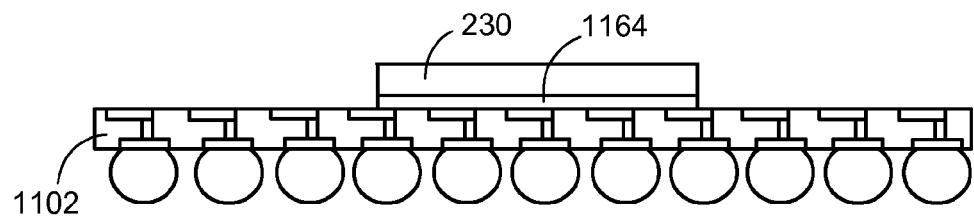
FIG. 12 is the structure of FIG. 11 in mounting the second integrated circuit over the carrier strip.

Referring now to FIG. 12, therein is shown the structure of FIG. 11 in mounting the second integrated circuit 230 over the carrier strip 1102. The second integrated circuit 230 can mount over the carrier strip 1102 with the adhesive 1164. For illustrative purposes, the second integrated circuit 230 is shown over the carrier strip 1102, although it is understood that the carrier strip 1102 can have multiple instantiations of the second integrated circuit 230.

Figure 13:
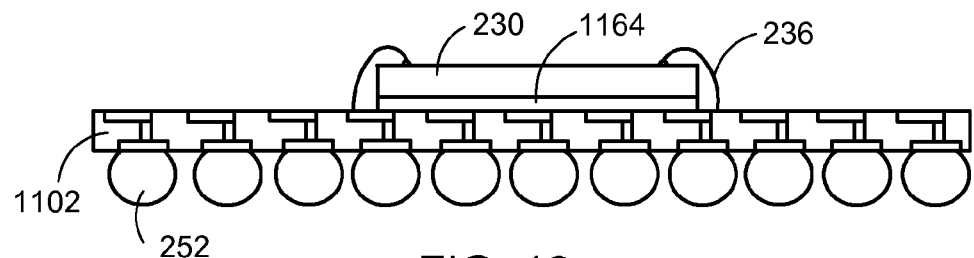
FIG. 13 is the structure of FIG. 12 in connecting the second integrated circuit and the carrier strip, and forming the external interconnects.

Referring now to FIG. 13, therein is shown the structure of FIG. 12 in connecting the second integrated circuit 230 and the carrier strip 1102, and forming the external interconnects 252. The second internal interconnects 236 can connect the second integrated circuit 230 and the carrier strip 1102. The external interconnects 252 can attach below and to the carrier strip 1102.

Figure 14:
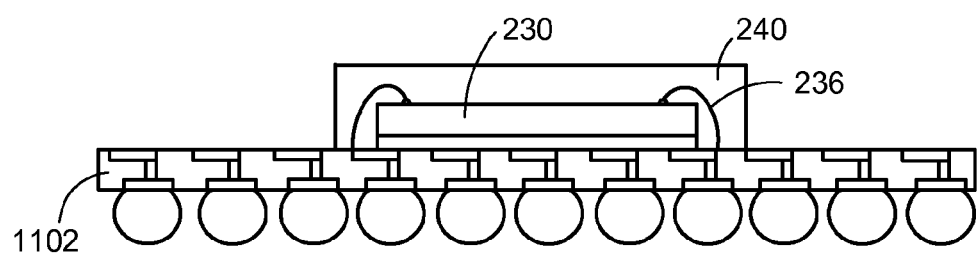
FIG. 14 is the structure of FIG. 13 in forming the second encapsulation.

Referring now to FIG. 14, therein is shown the structure of FIG. 13 in forming the second encapsulation 240. The second encapsulation 240 can be formed over the carrier strip 1102 to cover the second integrated circuit 230 and the second internal interconnects 236. The second encapsulation 240 can partially expose the carrier strip 1102. The carrier strip 1102 can be singulated forming the mountable integrated circuit package system 208 of FIG. 2.

Figure 15:
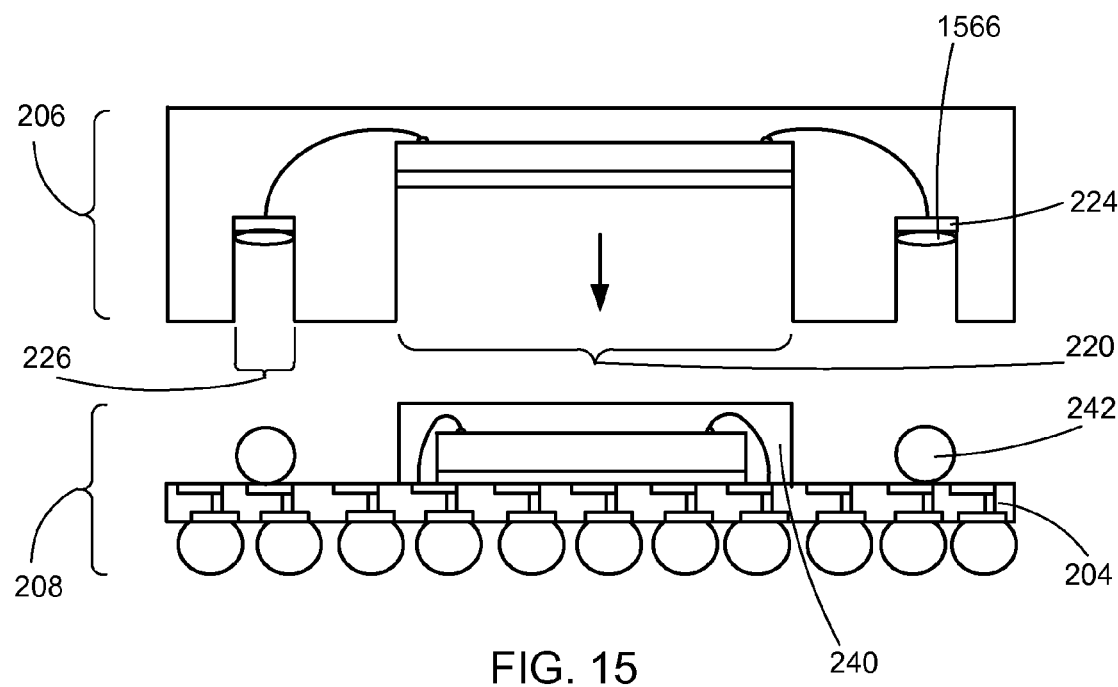
FIG. 15 is the structure of FIG. 14 in forming the stacked integrated circuit package system of FIG. 2.

Referring now to FIG. 15, therein is shown the structure of FIG. 14 in forming the stacked integrated circuit package system 100 of FIG. 2. The recessed integrated circuit package system 206, shown in FIG. 10, can mount over the mountable integrated circuit package system 208. An interconnect structure 1566, such as solder on pad, solder printing, or solder paste, can be formed under the conductive sites 224. The stacking interconnects 242 can be formed over the carrier 204.

The recessed integrated circuit package system 206 can mount over the mountable integrated circuit package system 208. The second encapsulation 240 can mount within the interior cavity 220 of the recessed integrated circuit package system 206. The stacking interconnects 242 fit within the peripheral cavities 226 of the recessed integrated circuit package system 206. The interconnect structure 1566 can form the conductive structure 244 of FIG. 2.

Figure 16:
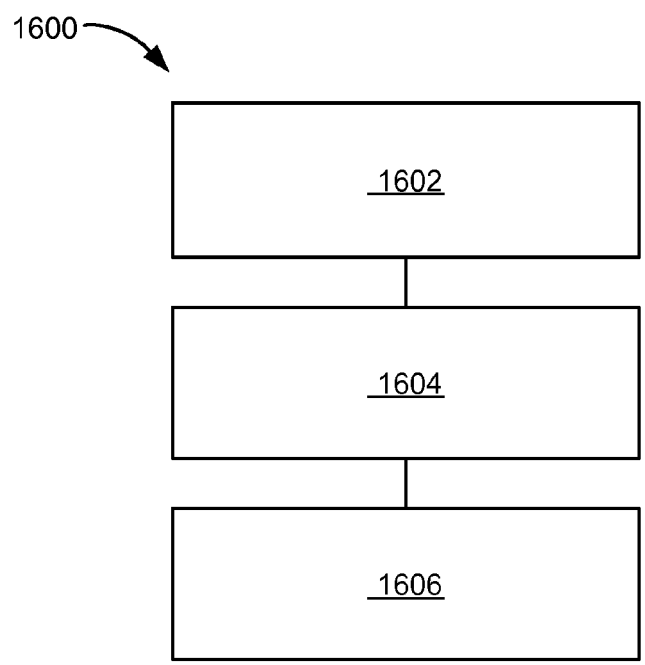
FIG. 16 is a flow chart of a stacked integrated circuit package system for manufacturing of the stacked integrated circuit package system in an embodiment of the present invention.

Referring now to FIG. 16, therein is shown a flow chart of a stacked integrated circuit package system 1600 for manufacturing of the stacked integrated circuit package system 100 in an embodiment of the present invention. The system 1600 includes forming a recessed integrated circuit package system having a first encapsulation over the first integrated circuit and an interior cavity in the first encapsulation in a block 1602; forming a mountable integrated circuit package system having a second integrated circuit over a carrier in a block 1604; and mounting the recessed integrated circuit package system over the mountable integrated circuit package system with the second integrated circuit within the interior cavity and the first integrated circuit coupled with the carrier in a block 1606.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the stacked integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a stacked integrated circuit package system comprising:

forming a recessed integrated circuit package system having a first encapsulation over a first integrated circuit, an interior cavity in the first encapsulation, a mounting structure, a conductive site comprised of substantially the same material as the mounting structure, and the first integrated circuit connected with the conductive site over a peripheral cavity of the first encapsulation;

forming a mountable integrated circuit package system having a second integrated circuit over a carrier; and mounting the recessed integrated circuit package system over the mountable integrated circuit package system with the second integrated circuit within the interior cavity and the first integrated circuit coupled with the carrier.

2. The method as claimed in claim 1 wherein forming the recessed integrated circuit package system includes:

forming the mounting structure and the conductive site comprised of substantially the same material as the mounting structure; and mounting the first integrated circuit over the mounting structure and over the interior cavity.

3. The method as claimed in claim 1 wherein:

forming the mountable integrated circuit package system includes forming a second encapsulation over the second integrated circuit; and mounting the recessed integrated circuit package system over the mountable integrated circuit package system includes fitting the second encapsulation within the interior cavity.

4. The method as claimed in claim 1 wherein:

forming the recessed integrated circuit package system includes connecting the first integrated circuit with the conductive site over the peripheral cavity of the first encapsulation;

forming the mountable integrated circuit package system includes forming a stacking interconnect over the carrier; and mounting the recessed integrated circuit package system over the mountable integrated circuit package system includes connecting the stacking interconnect within the peripheral cavity.

5. A method for manufacturing a stacked integrated circuit package system comprising:

forming a recessed integrated circuit package system having a first encapsulation over a first integrated circuit, an interior cavity in the first encapsulation, and the first encapsulation having a peripheral cavity with a conductive site exposed and a wall of the peripheral cavity in a non-vertical configuration includes:

forming a mounting structure and the conductive site comprised of substantially the same material as the mounting structure, mounting the first integrated circuit over the mounting structure and over the interior cavity, and connecting the first integrated circuit and the conductive site;

forming a mountable integrated circuit package system having a second integrated circuit over a carrier; and mounting the recessed integrated circuit package system over the mountable integrated circuit package system with the second integrated circuit within the interior cavity and the first integrated circuit coupled with the carrier.

6. The method as claimed in claim 5 wherein mounting the recessed integrated circuit package system over the mountable integrated circuit package system includes connecting the conductive site and the carrier.

7. The method as claimed in claim 5 wherein forming the mountable integrated circuit package system having the second integrated circuit includes mounting a flip chip over the carrier.

8. The method as claimed in claim 5 further comprising attaching an external interconnect below and to the carrier.

9. A stacked integrated circuit package system comprising:
a recessed integrated circuit package system having a first encapsulation over a first integrated circuit, an interior cavity in the first encapsulation, a mounting structure exposed by the first encapsulation. a conductive site exposed by the first encapsulation and comprised of substantially the same material as the mounting structure, and the first integrated circuit connected with the conductive site over a peripheral cavity of the first encapsulation: and
a mountable integrated circuit package system having a second integrated circuit over a carrier with the recessed integrated circuit package system thereover with the second integrated circuit within the interior cavity and the first integrated circuit coupled with the carrier.

10. The system as claimed in claim 9 wherein the recessed integrated circuit package system includes:
the mounting structure exposed by the first encapsulation;
the conductive site exposed by the first encapsulation and comprised of substantially the same material as the mounting structure; and
the first integrated circuit over the mounting structure and over the interior cavity.

11. The system as claimed in claim 9 wherein:
the mountable integrated circuit package system includes a second encapsulation over the second integrated circuit; and
the recessed integrated circuit package system over the mountable integrated circuit package system includes the second encapsulation within the interior cavity.

12. The system as claimed in claim 9 wherein:
the recessed integrated circuit package system includes the first integrated circuit connected with the conductive site over the peripheral cavity of the first encapsulation;
the mountable integrated circuit package system includes a stacking interconnect over the carrier; and
the recessed integrated circuit package system mounted over the mountable integrated circuit package system includes the stacking interconnect within the peripheral cavity.

13. The system as claimed in claim 9 wherein the recessed integrated circuit package system includes:
the mounting structure exposed by the first encapsulation;
the conductive site exposed by the first encapsulation and comprised of substantially the same material as the mounting structure; and
the first integrated circuit over the mounting structure and over the interior cavity, and connected with the conductive site.

14. The system as claimed in claim 13 wherein the recessed integrated circuit package system over the mountable integrated circuit package system includes the conductive site connected with the carrier.

15. The system as claimed in claim 13 wherein the recessed integrated circuit package system includes the first encapsulation having the peripheral cavity with the conductive site exposed and a wall of the peripheral cavity in a non-vertical configuration.

16. The system as claimed in claim 13 wherein the mountable integrated circuit package system having the second integrated circuit includes a flip chip over the carrier.

17. The system as claimed in claim 13 further comprising an external interconnect below and attached to the carrier.

* * * * *

UNITED STATES PATENT AND TRADEMARK OFFICE
CERTIFICATE OF CORRECTION

PATENT NO.         : 7,956,449 B2                                                       Page 1 of 1
APPLICATION NO.    : 12/146135
DATED              : June 7, 2011
INVENTOR(S)        : Lee et al.

It is certified that error appears in the above-identified patent and that said Letters Patent is hereby corrected as shown below:

Column 9:
line 65, delete "structure. and" and insert therefor --structure, and--
line 67, delete "encapsulation:" and insert therefor --encapsulation;--

Column 11:
line 5, delete "encapsulation. a" and insert therefor --encapsulation, a--
line 10, delete "encapsulation: and" and insert therefor --encapsulation; and--

Signed and Sealed this
Twentieth Day of March, 2012

David J. Kappos
*Director of the United States Patent and Trademark Office*